(12) United States Patent
Watanabe et al.

(10) Patent No.: US 8,896,108 B2
(45) Date of Patent: Nov. 25, 2014

(54) SEMICONDUCTOR DEVICE WITH PARASITIC BIPOLAR TRANSISTOR

(75) Inventors: Yuichi Watanabe, Tatebayashi (JP); Akira Yamane, Tatebayashi (JP); Yasuo Oishibashi, Ora-gun (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 147 days.

(21) Appl. No.: 13/229,079

(22) Filed: Sep. 9, 2011

(65) Prior Publication Data
US 2012/0068321 A1  Mar. 22, 2012

(30) Foreign Application Priority Data

Sep. 17, 2010 (JP) ................................. 2010-208814

(51) Int. Cl.
*H01L 23/495* (2006.01)
*H01L 27/02* (2006.01)
*H01L 23/00* (2006.01)

(52) U.S. Cl.
CPC ... *H01L 23/49575* (2013.01); *H01L 2224/2929* (2013.01); *H01L 2924/01082* (2013.01); *H01L 2224/05124* (2013.01); *H01L 2224/05147* (2013.01); *H01L 2224/73265* (2013.01); *H01L 2924/01013* (2013.01); *H01L 2224/48247* (2013.01); *H01L 2924/01033* (2013.01); *H01L 23/49513* (2013.01); *H01L 27/0288* (2013.01); *H01L 2224/29339* (2013.01); *H01L 2924/01079* (2013.01); *H01L 2924/01047* (2013.01); *H01L 2224/83851* (2013.01); *H01L 2924/014* (2013.01); *H01L 24/49* (2013.01); *H01L 23/49589* (2013.01); *H01L 2224/05644* (2013.01); *H01L 23/49537* (2013.01); *H01L 2924/01024* (2013.01); *H01L 24/05* (2013.01); *H01L 2224/32245* (2013.01); *H01L 2224/05083* (2013.01); *H01L 2224/04026* (2013.01); *H01L 2224/05171* (2013.01); *H01L 24/48* (2013.01); *H01L 2924/01029* (2013.01); *H01L 2224/49175* (2013.01); *H01L 2924/13055* (2013.01); *H01L 24/32* (2013.01); *H01L 2224/48245* (2013.01)
USPC .................... 257/676; 257/E23.052; 257/491

(58) Field of Classification Search
USPC ................. 257/491, 536, 539, 542, 577, 676, 257/E29.174, E29.175, E29.182, E23.052; 438/330–331, 382–385
See application file for complete search history.

(56) References Cited

U.S. PATENT DOCUMENTS

| 5,428,249 | A | * | 6/1995 | Sawayama et al. | ........... 257/746 |
| 5,473,192 | A | * | 12/1995 | Golubic et al. | ................ 257/684 |
| 5,886,409 | A | * | 3/1999 | Ishino et al. | .................... 257/737 |
| 2010/0052125 | A1 | | 3/2010 | Sasaki et al. | |

FOREIGN PATENT DOCUMENTS

| EP | 836230 A2 * | 4/1998 | .............. H01L 27/02 |
| JP | 2006-32479 | 2/2006 | |
| JP | 2010-80914 | 4/2010 | |

\* cited by examiner

*Primary Examiner* — Tucker Wright
(74) *Attorney, Agent, or Firm* — Rennie William Dover

(57) ABSTRACT

The invention enhances resistance to a surge in a semiconductor device having a semiconductor die mounted on a lead frame. An N type embedded layer, an epitaxial layer and a P type semiconductor layer are disposed on the front surface of a P type semiconductor substrate forming an IC die. A metal thin film is disposed on the back surface of the semiconductor substrate, and a conductive paste containing silver particles and so on is disposed between the metal thin film and a metal island. When a surge is applied to a pad electrode disposed on the front surface of the semiconductor layer, the surge current flowing from the semiconductor layer into the semiconductor substrate runs toward the metal island through the metal thin film.

20 Claims, 4 Drawing Sheets

SEMICONDUCTOR DEVICE WITH PARASITIC BIPOLAR TRANSISTOR

CROSS-REFERENCE OF THE INVENTION

This application claims priority from Japanese Patent Application No. 2010-208814, the content of which is incorporated herein by reference in its entirety.

BACKGROUND OF THE INVENTION

1. Field of the Invention

The invention relates to a semiconductor device, in particular, a semiconductor device having a semiconductor die mounted on a lead frame.

2. Description of the Related Art

In a semiconductor device having a plurality of semiconductor dies such as an IC die, as shown in FIG. 6, for example, an IC die 110A is bonded to an island 150 of a lead frame made of metal such as copper through a conductive paste 140.

A semiconductor device having a semiconductor die mounted on a lead frame is disclosed in Japanese Patent Application Publication Nos. 2010-80914 and 2006-32479, for example.

However, depending on the purpose of use of a semiconductor device, as shown in FIG. 6, a surge (a pulse-shaped overvoltage having a high leading edge of an amplitude) tends to be applied thereto through a pad electrode 111 disposed on the front surface of the IC die 110A. For example, when the semiconductor device is an igniter controlling an ignition plug on a vehicle, a large surge tends to be applied thereto due to noise occurring at other peripheral device on the vehicle such as a motor.

Depending on the amount of a surge, a surge current flowing from the pad electrode 111 into the semiconductor substrate 110 may reach the back surface of the semiconductor substrate 110 and cause dielectric breakdown. Then heat generated at the time may cause the semiconductor substrate 110 to crack, thereby breaking the igniter.

SUMMARY OF THE INVENTION

The invention provides a semiconductor die that includes a semiconductor substrate of a first conductive type, a first semiconductor layer of a second conductive type disposed on the front surface of the semiconductor substrate, a second semiconductor layer of the first conductive type disposed on the first semiconductor layer, and a first electrode and a second electrode that are in contact with the second semiconductor layer so that a current runs between the two electrodes through the second semiconductor layer under a normal input current condition. The die also includes a metal film disposed on the back surface of the semiconductor substrate so as to be in a direct physical contact with the back surface. The semiconductor die is bonded to an island of a lead frame by a conductive paste so that the metal film is attached to the island through the conductive paste, and the semiconductor substrate and the first and second semiconductor layers are configured to operate as a parasitic bipolar transistor so as to release an input current to the island under a surge event.

DETAILED DESCRIPTION OF THE INVENTION

Figure 1:
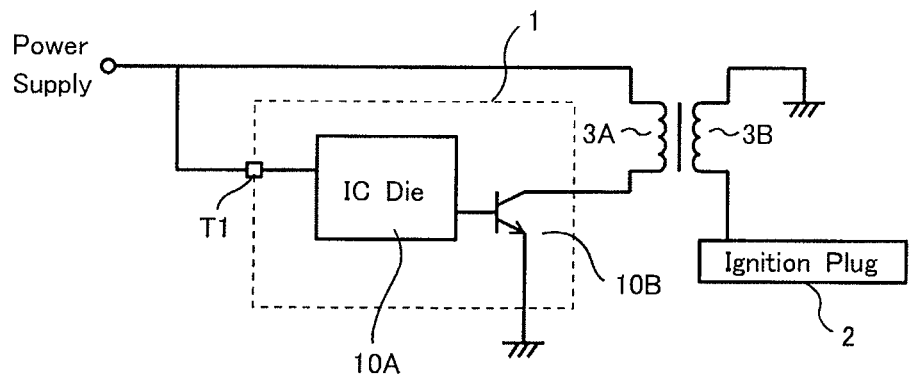
FIG. 1 is a circuit diagram showing a semiconductor device of an embodiment of the invention and the peripheral circuit.
Figure 2:
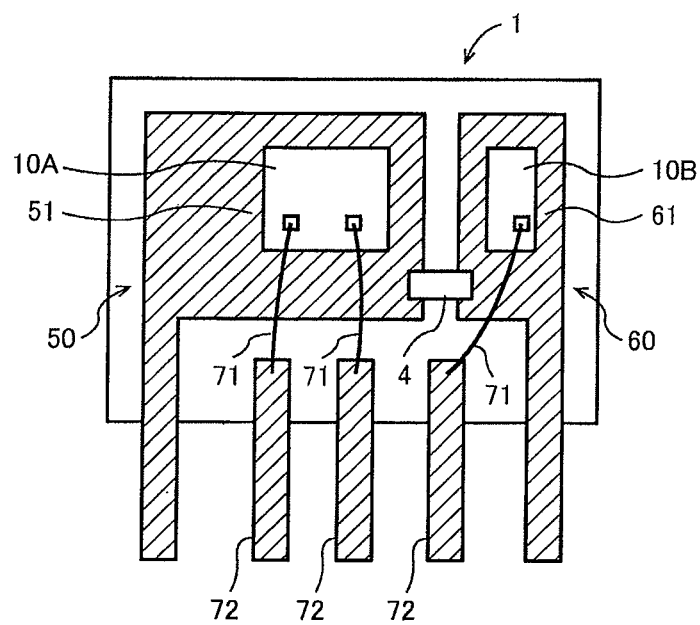
FIG. 2 is a plan view showing a schematic structure of the semiconductor device of the embodiment of the invention.

A semiconductor device of an embodiment of the invention will be described referring to figures. FIG. 1 is a circuit diagram showing a schematic structure of this semiconductor device and the peripheral circuit. This semiconductor device is a semiconductor device that tends to be applied with a surge (e.g. a pulse-shaped overvoltage having a high leading edge of an amplitude), for example, an igniter 1 for vehicles. FIG. 2 is a plan view showing a schematic structure of the igniter 1 in FIG. 1.

As shown in FIG. 1, the igniter 1 has a function of controlling the ignition of an ignition plug 2 of an engine on a vehicle, and includes a plurality of semiconductor dies, for example, an IC die 10A formed as a control circuit, an IGBT die 10B as a switching element, and so on. The igniter 1 controls the switching operation of the IGBT die 10B by the IC die 10A, and causes self-induction by blocking a current flowing from a power supply into a primary coil 3A of an ignition coil by the IGBT die 10B to generate a high voltage at a secondary coil 3B of the ignition coil. Ignition occurs when this high voltage is applied to the ignition plug 2.

In the igniter 1 mounted on a vehicle, a large surge caused by noise generated at other device such as a motor mounted on the vehicle tends to be applied to the IC die 10A through a power terminal T1 and wires. In particular, a surge tends to occur when the engine of a vehicle is stopped.

The IC die 10A and the IGBT die 10B forming the igniter 1 are respectively bonded to islands 51, 61 of lead frames 50, 60 made of metal such as copper, as shown in FIG. 2, for example, and sealed with a resin (not shown) according to need. In the figure, the IC die 10A and the IGBT die 10B are connected to lead terminals 72 through bonding wires 71. One of the plurality of lead terminals 72 is formed as the power terminal T1 connected to the power supply, for example. Furthermore, a die capacitor 4 is disposed between the two islands 51, 61, connecting these.

Figure 3:
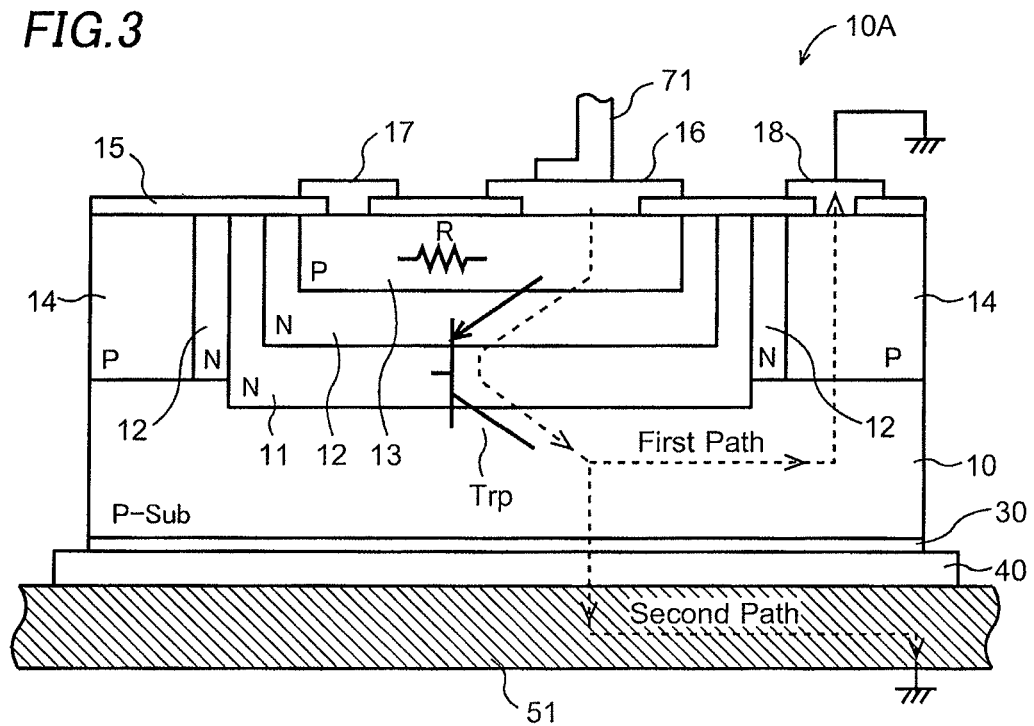
FIG. 3 is a cross-sectional view showing the semiconductor device of the embodiment of the invention.
Figure 4:
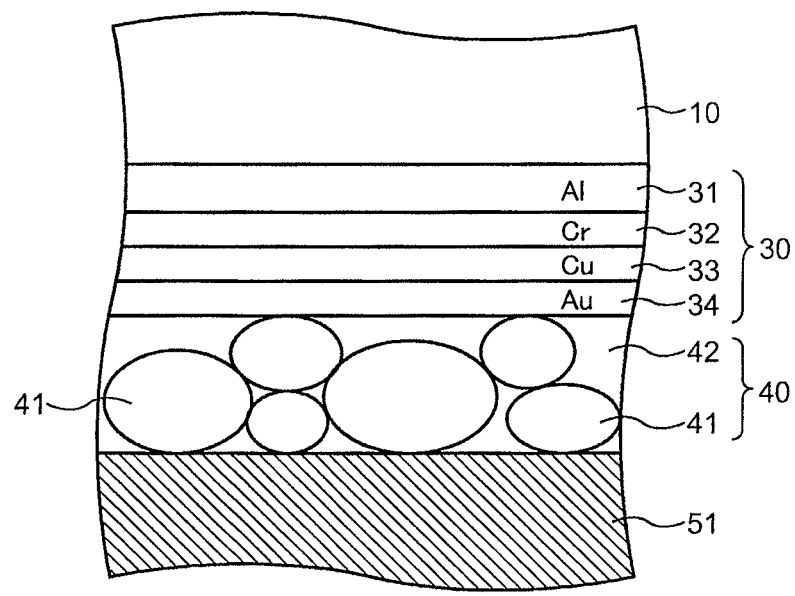
FIG. 4 is a cross-sectional view showing a layering structure of a metal thin film of the semiconductor device in FIG. 3.

Hereafter, the IC die 10A bonded to the island 51 of the lead frame 50 will be described referring to figures. FIG. 3 is a cross-sectional view showing the IC die 10A in the igniter 1. In FIG. 3, a region where a protective resistance layer is formed in the igniter 1 and the periphery are simply shown, and the other components, for example, a region where a transistor is formed is omitted in the figure. Furthermore, FIG. 4 is an enlarged cross-sectional view showing a layering structure of a metal thin film 30 in FIG. 3.

As shown in FIG. 3, the IC die 10A is formed by a semiconductor substrate 10 as a P type silicon substrate. In the front surface of the semiconductor substrate 10, an N type embedded layer 11 is disposed and an N type epitaxial layer 12 is disposed thereon. A P type semiconductor layer 13 is disposed in part of the front surface of the epitaxial layer 12. In the example shown in the figure, both the ends of the embedded layer 11 are extended to the front surface of the IC die 10A. The epitaxial layer 12 exists on the outside of both the ends of the embedded layer 11, and a P type element isolation layer 14 connected to the front surface of the semiconductor substrate 10 is disposed on the outside of the epitaxial layer 12.

The semiconductor layer 13 of the embodiment is used as the protective resistance layer of the igniter 1, which moderates a surge current by a predetermined resistance value R. In this case, one end of the front surface of the semiconductor layer 13 is connected to a pad electrode 16 through an opening of the insulation film 15. The pad electrode 16 is connected to the power supply through the bonding wire 71 connected to the power terminal T1 in FIG. 1. Another end of the semiconductor layer 13 is connected to a wire 17 through an opening of the insulation film 15. The wire 17 is connected to other element (not shown). The element isolation layer 14 is connected to a grounded wire 18 through an opening of the insulation film 15.

The metal thin film 30 is disposed on the back surface side of the IC die 10A, being in direct contact with the back surface of the semiconductor substrate 10 and covering the back surface. It is preferable that the metal thin film 30 covers the whole back surface of the semiconductor substrate 10. A conductive paste 40 made of conductive particles and a resin is disposed between the metal thin film 30 and the island 51. The conductive paste 40 is in direct contact with the metal thin film 30 and with the grounded island 51.

It is preferable that the conductive paste 40 is a silver paste containing silver particles as conductive particles. Die-bonding using a silver paste has an advantage that the process temperature for bonding and the manufacturing cost are lower than those of die-bonding using other material, for example, a lead-free solder.

In a process of manufacturing an IC die, an oxide film, namely, a natural oxide film (not shown) is formed on the back surface of the semiconductor substrate 10, which is naturally formed by the oxidation of the semiconductor substrate 10 as a silicon substrate after back grinding, for example. Immediately after this natural oxide film is removed by, for example, a plasma etching treatment, the metal thin film 30 is formed on the back surface of the semiconductor substrate 10 by a vapor deposition method. By this, the back surface of the semiconductor substrate 10 and the metal thin film 30 are in direct contact with each other without through the natural oxide film, and realizes a stable current flow from the semiconductor substrate 10 to the island 51.

As shown in FIG. 4, the metal thin film 30 is formed by sequentially layering an aluminum layer 31 formed being in direct contact with the back surface of the semiconductor substrate 10, a chromium layer 32, a copper layer 33 and a gold layer 34 on the back surface side of the IC die 10A, i.e., on the back surface side of the semiconductor substrate 10. The aluminum layer 31 enhances the contact with the semiconductor substrate 10, the chromium layer 32 prevents inter-reaction between the aluminum layer 31 and the copper layer 33, the copper layer 33 decreases the total electric resistance of the metal thin film 30, and the gold layer 34 prevents the oxidation of the surface of the copper layer 33. The gold layer 34 is in direct contact with the conductive paste 40 containing conductive particles 41 (preferably, silver particles) and a resin 42. This metal thin film 30 has a thickness of, for example, about 0.5 to 1.5 µm in total.

In this IC die 10A, as apparent from the cross-sectional structure in FIG. 3, a PNP bipolar transistor that uses the P type semiconductor substrate 10 as a collector, the N type embedded layer 11 and epitaxial layer 12 as a base, and the P type semiconductor layer 13 as an emitter, i.e., a parasitic transistor Trp is formed.

When the potential of a surge applied to the semiconductor layer 13 through the bonding wire 71 and the pad electrode 16 is high enough to break down the parasitic transistor Trp, the surge current flows into the P type semiconductor substrate 10 from the semiconductor layer 13 through the parasitic transistor Trp. This surge current flows into the grounded wire 18 through the P type element isolation layer 14 (i.e. a first path), and also flows into the grounded island 51 from the back surface of the semiconductor substrate 10 through the metal thin film 30 (i.e. a second path).

When the parasitic transistor Trp does not break down even when a surge is applied to the semiconductor layer 13, the surge current does not flow into the semiconductor substrate 10 and is moderated corresponding to the resistance value R of the semiconductor layer 13 as a protective resistance layer and flows in the wire 17.

Figure 5:
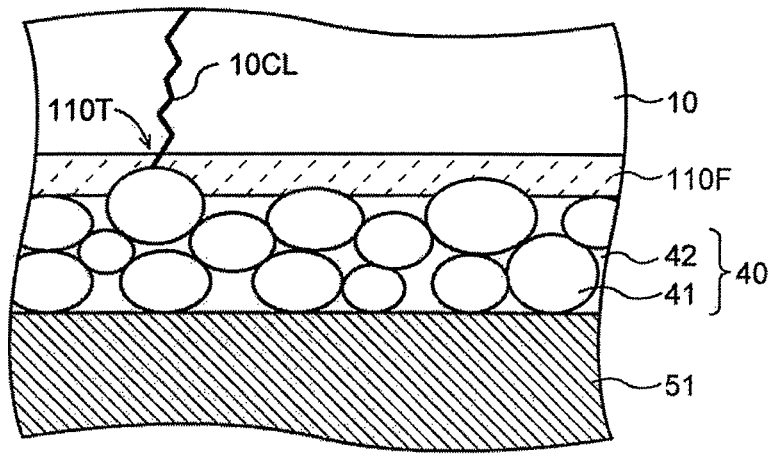
FIG. 5 is a cross-sectional view showing a semiconductor device of a comparison example.
Figure 6:
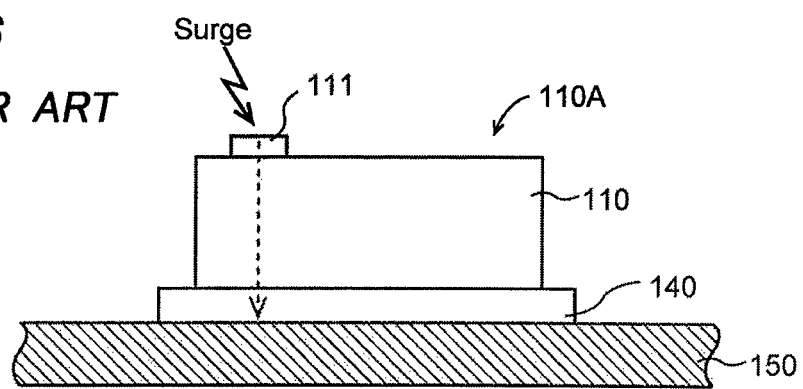
FIG. 6 is a cross-sectional view showing a conventional semiconductor device.

Here, a case where the metal thin film 30 is not formed on the back surface of the semiconductor substrate 10 as a comparison example relative to the structure of the IC die 10A described above will be considered. In this case, as shown in a cross-sectional view in FIG. 5, a natural oxide film 110F remains on the back surface of the semiconductor substrate 10, which is formed by the oxidation of the semiconductor substrate 10 as a silicon substrate after the back-grinding of the semiconductor substrate 10, for example. Then, with this state, the conductive paste 40 is disposed between the natural oxide film 110F and the island 51.

This natural oxide film 110F does not have a constant thickness and a constant state on the back surface of the semiconductor substrate 10, and partially has a portion where the dielectric strength is low to easily cause dielectric breakdown, for example, a thin portion 110T. Therefore, when a surge current flows into the semiconductor substrate 10 through the parasitic transistor Trp, in the portion 110T of the natural oxide film 110F, which easily causes dielectric breakdown, dielectric breakdown occurs due to the surge current with high current density. With heat generated at the time, a crack 10CL occurs in the semiconductor substrate 10 and the IC die 10A is damaged. This crack 10CL may extend from the semiconductor substrate 10 to the semiconductor layer 13 that is superposed on the pad electrode 16, and may further extend to the interface of the pad electrode 16 and the semiconductor layer 13 to penetrate the IC die 10A.

On the contrary, in the IC die 10A of the embodiment, a surge current flowing into the P type semiconductor substrate 10 through the parasitic transistor Trp flows in the first path directed to the P type element isolation layer 14 and the grounded wire 18 and further flows in the second path directed to the grounded island from the back surface of the semiconductor substrate 10 through the metal thin film 30. Therefore, the crack 10CL does not occur in the semiconductor substrate 10 and so on by the dielectric breakdown of the natural oxide film 110F, preventing the IC die 10A from being damaged. In particular, when the metal thin film 30 is formed over the whole back surface of the semiconductor substrate 10, the second path is widened to realize a stable surge current flow from the semiconductor substrate 10 to the island 51.

The invention is not limited to the embodiment described above, and modifications are possible within the scope of the invention.

For example, in the embodiment described above, the description is given for the case where the semiconductor layer 13 of the IC die 10A is the protective resistance layer of the igniter 1. However, the invention is not limited to this and also applicable to a region where other element, for example, a transistor is formed. In this case, the transistor is formed by using at least the P type semiconductor substrate 10, the N type embedded layer 11, the epitaxial layer 12 and the P type semiconductor layer 13.

Furthermore, the semiconductor device of the embodiment described above is referred to as the igniter 1 for vehicles, the invention is not limited to this and also applicable to other semiconductor device for vehicles as long as a surge tends to be applied thereto. Accordingly, the resistance to a surge in a semiconductor device is enhanced.

What is claimed is:

1. A semiconductor die comprising:
   a semiconductor substrate of a first conductive type;
   a first semiconductor layer of a second conductive type disposed on a front surface of the semiconductor substrate;
   a second semiconductor layer of the first conductive type disposed on the first semiconductor layer;
   a first electrode and a second electrode that are in contact with the second semiconductor layer so that a current runs between the two electrodes through the second semiconductor layer under a normal input current condition;
   a metal film disposed on a back surface of the semiconductor substrate so as to be in a direct physical contact with the back surface, wherein the semiconductor die is bonded to an island of a lead frame by a conductive paste so that the metal film is attached to the island through the conductive paste, and the semiconductor substrate and the first and second semiconductor layers are configured to operate as a parasitic bipolar transistor so as to release a first portion of an input current along a second path to the island in response to a surge event, wherein the semiconductor substrate, the first semiconductor layer, the second semiconductor layer, the first electrode, and the metal film cooperate to form the second path;
   an isolation layer in contact with the semiconductor substrate; and
   a third electrode, the third electrode in contact with the isolation layer, wherein the substrate, the isolation layer, and the third electrode serve as a first path along which a second portion of the input current is released in response to the surge event.

2. The semiconductor die of claim 1, wherein the metal film comprises an aluminum layer, a chromium layer, a copper layer and a gold layer that are sequentially layered on the back surface side of the semiconductor substrate.

3. The semiconductor die of claim 2, wherein the aluminum layer, the chromium layer, the copper layer and the gold layer are sequentially layered in this order from the back surface of the semiconductor die and to the island of the frame.

4. The semiconductor die of claim 3, wherein a thickness of the metal film is 0.5 to 1.5 μm.

5. The semiconductor die of claim 1, wherein the conductive paste is a silver paste comprising silver particles.

6. The semiconductor die of claim 1, wherein the first electrode is connected to a power supply.

7. The semiconductor die of claim 1, wherein the semiconductor die is a semiconductor device for a vehicle.

8. The semiconductor die of claim 1, wherein the semiconductor die is a semiconductor device for an igniter.

9. The semiconductor die of claim 1, wherein naturally formed oxide does not exist between the back surface of the semiconductor die and the metal.

10. The semiconductor die of claim 9, wherein a native oxide has been removed from the back of the semiconductor die by plasma etching.

11. A semiconductor die comprising:
    a semiconductor substrate of a first conductive type;
    a first semiconductor layer of a second conductive type disposed on a front surface of the semiconductor substrate;
    a second semiconductor layer of the first conductive type disposed on the first semiconductor layer;
    a first electrode and a second electrode that are in contact with the second semiconductor layer so that a current runs between the two electrodes through the second semiconductor layer under a normal input current condition;
    a third semiconductor layer of the first conductivity type disposed on the front surface of the semiconductor substrate and adjacent the first semiconductor layer, and a third electrode that is in contact with the third semiconductor layer so as to connect the third semiconductor layer to a ground; and
    a metal film disposed on a back surface of the semiconductor substrate so as to be in a direct physical contact with the back surface, wherein the semiconductor die is bonded to an island of a lead frame by a conductive paste so that the metal film is attached to the island through the conductive paste, and the semiconductor substrate and the first and second semiconductor layers are configured to operate as a parasitic bipolar transistor so as to release an input current to the island when the parasitic bipolar transistor breaks down under a surge event.

12. The semiconductor die of claim 11, wherein the semiconductor die is a semiconductor device for a vehicle.

13. A semiconductor device comprising:
    a lead frame comprising a first island, a second island and a lead, the lead receiving a power voltage;
    a semiconductor die disposed on the first island so as to be electrically connected to the first island;
    a conductive paste disposed on the first island so as to be electrically connected to the first island;
    a conductive paste disposed between the semiconductor die and the first island; and
    a switching element disposed on the second island;
    wherein the semiconductor die comprises;
    a semiconductor substrate of a first conductivity type;
    a first semiconductor layer of a second conductivity type disposed on a front surface of the semiconductor substrate;
    a second semiconductor layer of the first conductivity type disposed on the first semiconductor layer;
    a first electrode and a second electrode that are in contact with the second semiconductor layer so that a current runs between the two electrodes through the second semiconductor layer under a normal input current condition, the first electrode being connected to the lead; and
    a metal film disposed on a back surface of the semiconductor substrate so as to be in contact with the back surface; and
    wherein the semiconductor substrate and the first and second semiconductor layers are configured to operate as a parasitic bipolar transistor so as to release an input current to the first island when the parasitic bipolar transistor breaks down under a surge event.

14. The semiconductor die of claim 13, wherein the switching element is an IGBT die.

15. The semiconductor die of claim 13, further comprising a capacitor connecting the first island and the second island.

16. The semiconductor die of claim 13, wherein the conductive paste comprises silver.

17. The semiconductor die of claim 13, further including:
- an isolation layer in contact with the semiconductor substrate; and
- a third electrode, the third electrode in contact with the isolation layer, the substrate, the isolation layer, and the third electrode serving as a first path along which a portion of the input current is released in response to the surge event.

18. The semiconductor die of claim 17, wherein the isolation structure comprises semiconductor material of the first conductivity type.

19. The semiconductor die of claim 18, further comprising a semiconductor material of the second conductivity type, the semiconductor material of the second conductivity type between the first and second layers of semiconductor material of the first conductivity type and the isolation structure.

20. The semiconductor die of claim 19, wherein the metal layer is coupled for receiving a first source of potential and the third electrode is coupled for receiving a second source of potential, the first and second sources of potential at the same level.

* * * * *